US010199315B2

(12) United States Patent
Farooq et al.

(10) Patent No.: US 10,199,315 B2
(45) Date of Patent: Feb. 5, 2019

(54) POST ZERO VIA LAYER KEEP OUT ZONE OVER THROUGH SILICON VIA REDUCING BEOL PUMPING EFFECTS

(71) Applicant: GLOBALFOUNDRIES Inc., Grand Cayman (KY)

(72) Inventors: Mukta Ghate Farooq, Hopewell Junction, NY (US); John Matthew Safran, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/249,700

(22) Filed: Aug. 29, 2016

(65) Prior Publication Data
US 2018/0061749 A1 Mar. 1, 2018

(51) Int. Cl.
*H01L 29/40* (2006.01)
*H01L 23/498* (2006.01)
(Continued)

(52) U.S. Cl.
CPC ...... *H01L 23/49827* (2013.01); *H01L 21/486* (2013.01); *H01L 21/4846* (2013.01);
(Continued)

(58) Field of Classification Search
None
See application file for complete search history.

(56) References Cited

U.S. PATENT DOCUMENTS 7,846,837 B2 * 12/2010 Kuo ............ H01L 21/76898
438/667
2010/0102454 A1 * 4/2010 Akiyama ...... H01L 21/76898
257/774
(Continued)

FOREIGN PATENT DOCUMENTS

TW 201539660 A 10/2015

OTHER PUBLICATIONS

Rabie, et al. "Novel stress-free keep out zone process development for via middle tsv in 20 nm planar CMOS technolgy" GlobalFoundries, Inc. 2014.
(Continued)

*Primary Examiner* — Nishath Yasmeen
(74) *Attorney, Agent, or Firm* — Anthony Canale; Hoffman Warnick LLC

(57) ABSTRACT

An IC structure and related method are provided. The IC structure includes: a semiconductor substrate and a TSV disposed within the semiconductor substrate. A first interconnect layer includes a plurality of V0 vias disposed on the TSV, where the plurality of V0 vias are positioned laterally within an upper surface area of the TSV. At least one second interconnect layer disposed over the first interconnect layer includes a plurality of vias laterally positioned outside of a keep out zone positioned over the TSV. The method includes forming a first interconnect layer including a plurality of V0 vias disposed on a TSV, the V0 vias positioned laterally within an upper surface area of the TSV, and forming at least one second interconnect layer disposed over the first inter-
(Continued)

connect layer and including a plurality of vias laterally positioned outside of a keep out zone positioned over the TSV.

15 Claims, 5 Drawing Sheets

(51) Int. Cl.
    *H01L 21/48*     (2006.01)
    *H01L 23/48*     (2006.01)
    *H01L 23/522*     (2006.01)
    *H01L 23/532*     (2006.01)

(52) U.S. Cl.
    CPC .......... *H01L 23/481* (2013.01); *H01L 23/498* (2013.01); *H01L 23/49838* (2013.01); *H01L 23/5226* (2013.01); *H01L 23/5329* (2013.01)

(56) References Cited

U.S. PATENT DOCUMENTS

| | | | |
|---|---|---|---|
| 2011/0031581 A1* | 2/2011 | West | H01L 23/481 257/508 |
| 2013/0181330 A1 | 7/2013 | Ramachandran et al. | |
| 2014/0175651 A1* | 6/2014 | Pelto | H01L 23/481 257/751 |
| 2015/0076706 A1* | 3/2015 | Kamineni | G06F 17/5077 257/774 |
| 2015/0270209 A1 | 9/2015 | Woychik et al. | |

OTHER PUBLICATIONS

Li, et al. "Impact of Cu TSVs on BEOL metal and dielectric reliability" Imec, Kapeldreef 75, 3001 Leuven Belgium 2014.
TW Office Action and Search Report and English Translation thereof for Taiwanese Patent Application No. 10720610910 dated Jul. 5, 2018, 9 pages.

* cited by examiner

POST ZERO VIA LAYER KEEP OUT ZONE OVER THROUGH SILICON VIA REDUCING BEOL PUMPING EFFECTS

BACKGROUND

The present disclosure relates to integrated circuit (IC) structures, and more specifically, to IC structures having vias in post zero via layers positioned outside of a keep out zone over a TSV to reduce stresses caused by pumping.

In integrated circuit (IC) structures, through silicon vias (TSVs) are relatively large vertically extending contacts used to electrically couple substrates that include circuitry. Each TSV extends through the respective substrate and couples to back-end-of-line (BEOL) interconnects such as vias and metal wires. BEOL refers to IC structure fabrication steps performed on the semiconductor wafer in the course of device manufacturing following first metallization. TSVs allow three-dimensional stacking of advanced ICs. TSVs use copper surrounded by a refractory metal liner to prevent diffusion of the copper into surrounding materials. TSVs may extend through dielectric material and semiconductor material, the latter of which may include active devices such as transistors.

As current semiconductor technology nodes reach wiring sizes of less than 10 nanometers, one challenge related to TSVs is referred to as 'pumping'. Pumping is a phenomenon in which end surfaces of TSVs deform due to stresses created by the large differences in coefficient of thermal expansion (CTEs) between the copper and the surrounding semiconductor materials. That is, the CTE differences cause stress build up in the TSV and surrounding materials, and cause ends of the TSV to deform, for example, by becoming domed shape. The deformation is transferred through a zero via (V0) interconnect layer that directly contacts the TSV and a first metal layer thereover to other interconnect layers positioned over the TSV. Interconnects within a periphery of the TSV in the later interconnect layers, such as regular copper vias in a first via layer V1 above first metal layer M1, second metal layer M2, etc., are impacted by the pumping as is the lifespan of dielectric layers thereabout. Zero vias (V0) placed over a center of the TSV are known to experience the greatest amount of stress with or without copper pumping and are more susceptible to stress induced voiding (SIV). The TSV deformation can also cause dishing in a first metal layer dielectric due to the raised area requiring additional planarization. The pumping issue is magnified as technology advances to ever smaller and more sensitive wiring sizes.

Approaches to control the pumping include creating smaller TSVs with lower copper volume, annealing the copper prior to planarization to relieve the stress and diminish any deformation, or control the copper microstructure in the TSV. Unfortunately, not all of these approaches are always controllable during semiconductor fabrication. For example, TSV size/volume or when an anneal is performed cannot be altered without departing from a particular IC design specification. In addition, annealing is not always effective. Another approach to improve SIV reliability has been to offset the zero vias (V0) that are in contact with an upper surface of the TSV with respect the TSV center.

SUMMARY

A first aspect of the disclosure is directed to an integrated circuit (IC) structure, comprising: a semiconductor substrate; a through silicon via (TSV) disposed within the semiconductor substrate; a first interconnect layer including a plurality of zero layer (V0) vias disposed on the TSV, the plurality of V0 vias positioned laterally within an upper surface area of the TSV; and at least one second interconnect layer disposed over the first interconnect layer and including a plurality of vias laterally positioned outside of a keep out zone positioned over the TSV.

A second aspect of the disclosure includes an integrated circuit structure, comprising: a semiconductor substrate; a through silicon via (TSV) disposed within the semiconductor substrate; a first interconnect layer including a plurality of zero layer (V0) vias disposed over the TSV, the plurality of V0 vias positioned laterally within an upper surface area of the TSV; and at least one second interconnect layer disposed over the first interconnect layer and including a plurality of vias none of which are positioned over a keep out zone defined by an entirety of the upper surface area of the TSV.

A third aspect includes a method, comprising: forming a through silicon via (TSV) within a semiconductor substrate; forming a first interconnect layer including a plurality of zero layer (V0) vias disposed on the TSV, the plurality of V0 vias positioned laterally within an upper surface area of the TSV; and forming at least one second interconnect layer disposed over the first interconnect layer and including a plurality of vias laterally positioned outside of a keep out zone positioned over the TSV.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

An integrated circuit (IC) structure and method of forming same are provided herein. The IC structure includes interconnect layers above a zero via (V0) layer over a through silicon via (TSV) that have vias outside of a keep out zone over at least a portion of the TSV. The placement of vias in interconnect layers after the V0 layer outside of the keep out zone over the TSV reduces stresses created by pumping and reduces first metal layer (M1) dishing, but negligibly increases resistance.

Figure 1:
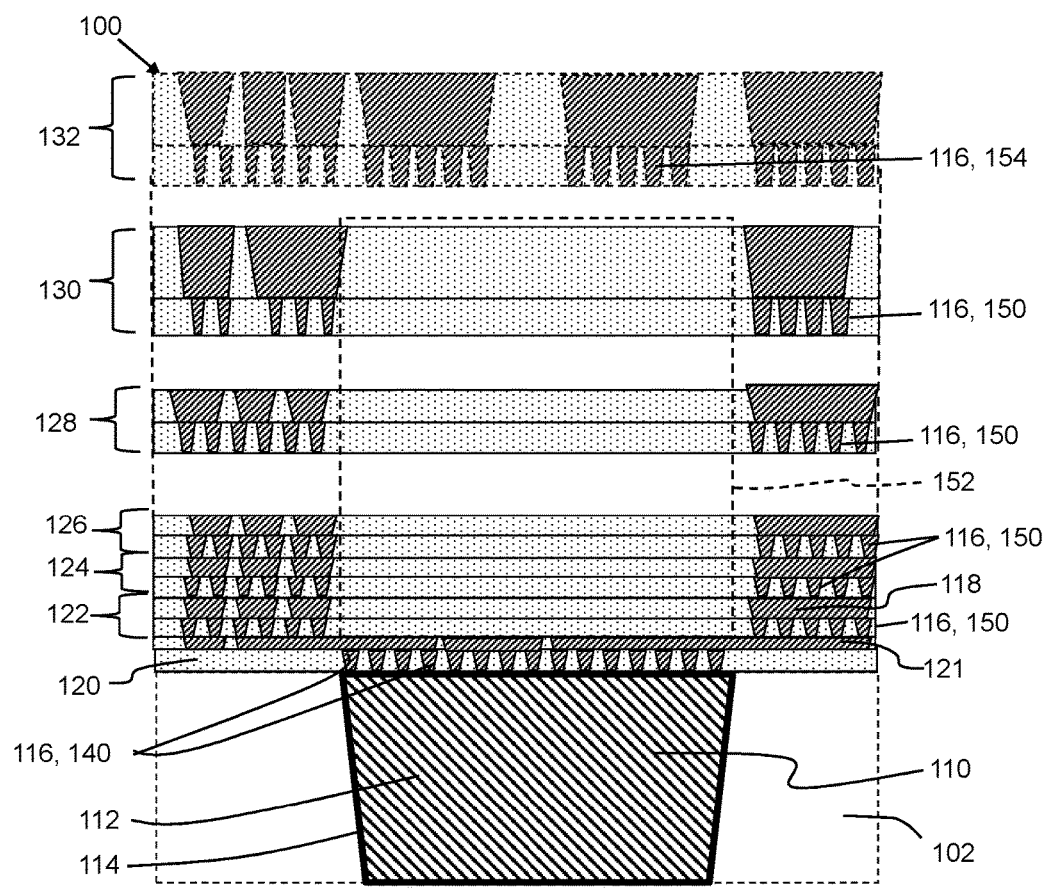
FIG. 1 shows a cross-sectional view of an IC structure including a TSV according to embodiments of the disclosure.

FIG. 1 shows a cross-sectional view of an IC structure 100 according to one embodiment of the disclosure. IC structure 100 may include a semiconductor substrate 102 and a through silicon via (TSV) 110 disposed within semiconductor substrate 102. Substrate 102 may include any now known or later developed semiconductor material such as but not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate 102 may be strained. Any variety of semiconductor devices and related structure(s) (not shown) can be provide in the semiconductor substrate as known in the art, e.g., transistors, resistors, trench isolations, etc.

TSV 110 may include any now known or later developed vertically extending interconnect that passes through semiconductor substrate 102. As understood, TSV 110 may connect IC structure 100 to other IC structures(s) (not shown). TSV 110 may be formed using any now known or later developed processes, and may include a conductor 112, typically copper, and a refractory metal liner 114. Refractory metal liner 114 may include, for example, ruthenium; however, other refractory metals such as tantalum (Ta), titanium (Ti), tungsten (W), iridium (Ir), rhodium (Rh) and platinum (Pt), etc., or mixtures of thereof, may also be employed. IC structure 100 also includes a number of back-end-of-line (BEOL) interconnect layers 120, 122, 124, 126, 128, 130 (hereinafter "interconnect layers") that include successively larger conductive interconnects such as vias 116 and wires 118 (only one labeled) with respective dielectric layers. BEOL references operations performed on the semiconductor substrate 102 in the course of device manufacturing following a first metallization layer 121, i.e., in or on top surface of substrate 102. While six interconnect layers are illustrated, it is understood that any number of interconnect layers may be used. Interconnect layers 120-130 may employ any appropriate interlayer dielectric material such as but not limited to: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, or other low dielectric constant (<3.9) material, or layers thereof. Vias and wires in interconnect layers 120-130 may be formed using any now known or later developed techniques, e.g., dielectric deposition, patterning, etching, refractory metal liner deposition, conductor deposition, planarization, capping layer deposition, etc. Each wire and via may include any conventional structure, e.g., similar to that described for TSV but smaller in scale. While each interconnect layer 120-130 is shown with a single dielectric material, it will be appreciated that many layers of dielectric material can be employed at each interconnect layer and that some layers typically used, e.g., capping layers, have been removed for clarity.

Figure 2:
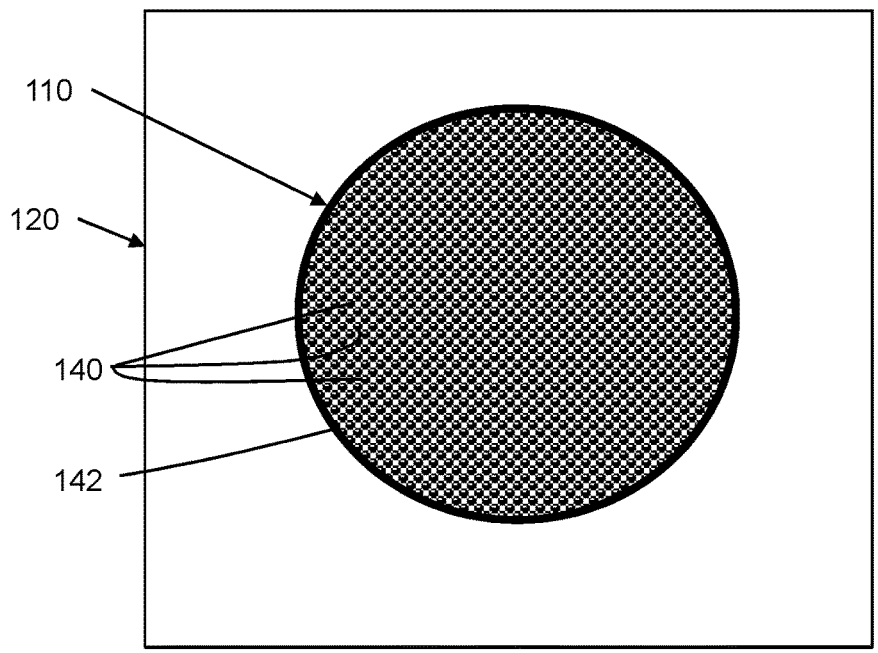
FIG. 2 shows a plan view of a zero via layer of the IC structure of FIG. 1.

A first interconnect layer 120 is referred to as a zero via interconnect layer (V0) and includes a plurality of vias referred to as zero layer (V0) vias 140 disposed on TSV 110. That is, V0 vias 140 are directly positioned on TSV 110 with no intervening structure. In addition, as shown in the plan view of FIG. 2 of first interconnect layer 120, V0 vias 140 are positioned laterally within an upper surface area 142 of TSV 110. That is, V0 vias 140 are positioned laterally within a periphery of TSV 110. Upper surface area or periphery 142 indicates an uppermost area of TSV 110 upon which V0 vias 140 may land. In the description, upper surface area 142 is indicated as circular, it is emphasized however that TSV 110 may have an upper surface having a variety of alternative shapes, e.g., polygonal, oblong, oval, etc. Although not shown, zero via (first) interconnect layer 120 may also include V0 vias 140 outside upper surface area 142, e.g., in the white area in FIG. 2.

Figure 3:
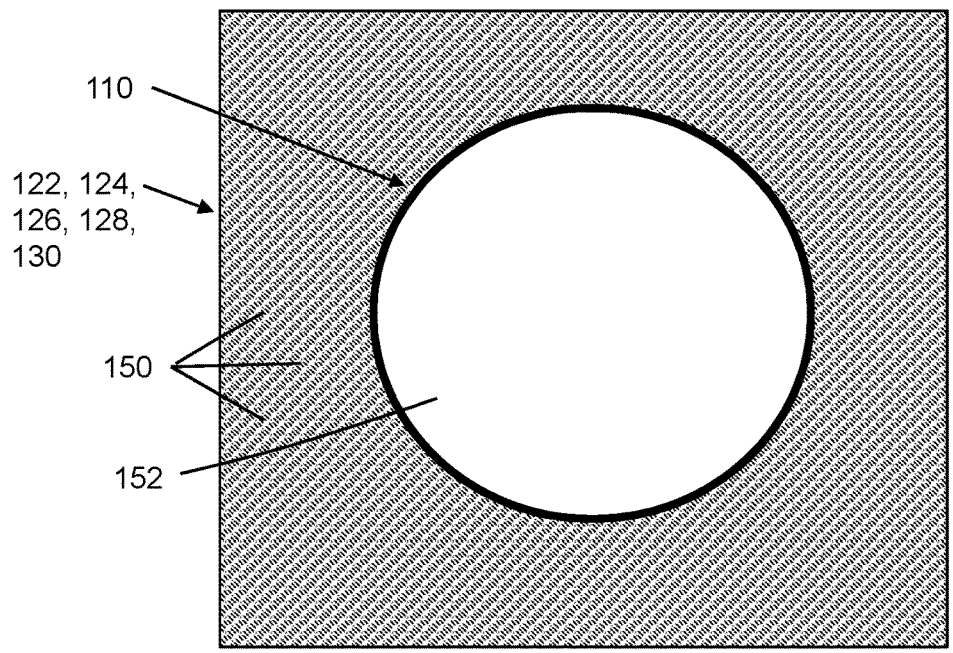
FIG. 3 shows a plan view of a post zero via layer interconnect layer of the IC structure of FIG. 1 with no vias over a keep out zone over the TSV.

Returning to FIG. 1 and with reference to FIG. 3, in one embodiment of the disclosure, at least one post zero via layer (second) interconnect layer 122, 124, 126, 130 disposed over zero via layer (first) interconnect layer 120 includes a plurality of vias 150 arranged such that none of vias 150 are positioned over a keep out zone 152 (phantom box in FIG. 1) defined by an entirety of upper surface area 142 (FIG. 2) of TSV 110. That is, an area of keep out zone 152 matches upper surface area 142 of TSV 110, and extends vertically above TSV 110. In this embodiment, the space extending vertically above TSV 110 is devoid of vias 150. As shown, keep out zone 152 may extend through a plurality of second interconnect layer 122, 124, 126, 128, 130 disposed over first interconnect layer 120 with each second interconnect layer including a plurality of vias 150, none of which are positioned within keep out zone 152 over TSV 110. Any number of second interconnect layers 122-130 may be employed to mitigate effects of TSV 110 copper pumping and improve the integrity of BEOL structures. Keep out zone 152 may also be devoid of any conductors, e.g., wires 118.

In one embodiment, as shown in FIG. 1, IC structure 100 may include only post zero via interconnect layers 122-130 that include no vias over keep out zone 152, i.e., all the way to a last and outermost interconnect layer 130. As also shown in FIG. 1, in an optional embodiment, IC structure 100 may also include a post zero vial layer (third) interconnect layer 132 (shown in phantom) over the at least one second interconnect layer 122-130, where interconnect layer 132 includes a via 154 positioned inside keep out zone 152 positioned over TSV 110. Third interconnect layer 132 may be sufficiently vertically spaced from TSV 110 that any residual stresses transmitted through keep out zone 152 are negligible such that vias 154 may exist over TSV 110 without the pumping issues described herein arising.

Figure 4:
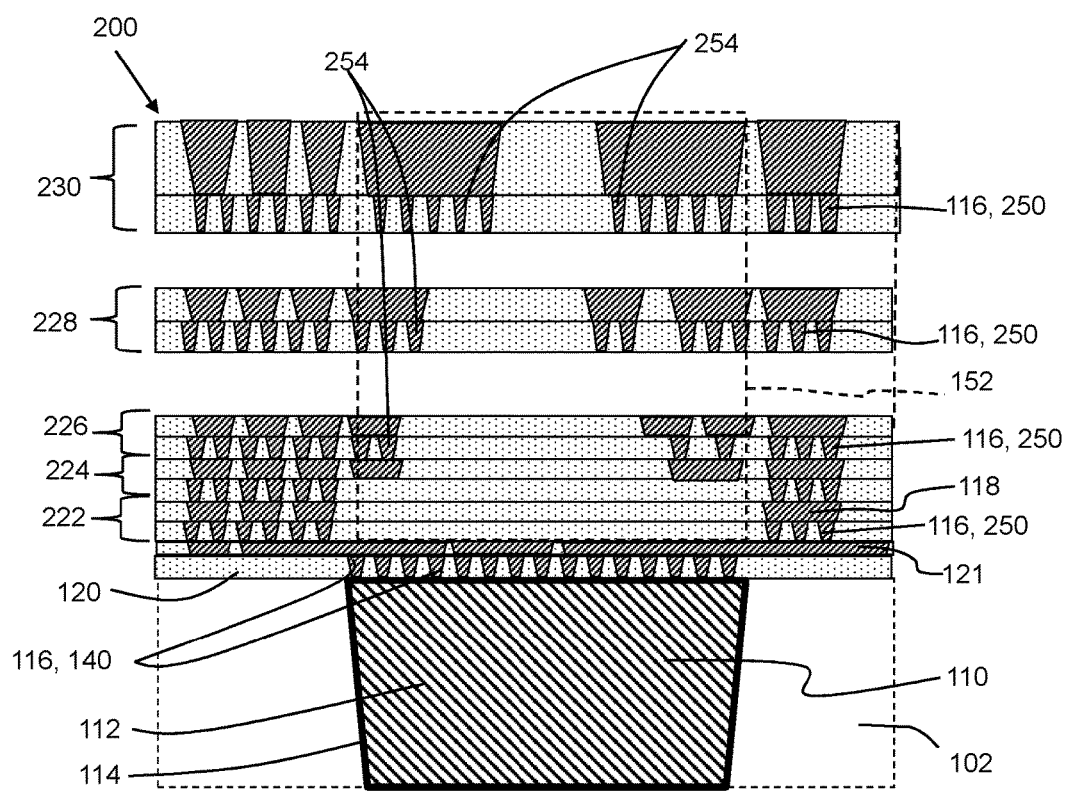
FIG. 4 shows a cross-sectional view of an IC structure including a TSV according to another embodiment of the disclosure.

Referring to FIG. 4, a cross-sectional view of a second embodiment of an IC structure 200 according to embodiments of the disclosure is illustrated. IC structure 200 is similar to IC structure 100. More specifically, IC structure 200 may include at least one post zero via (second) interconnect layer 222, 224 (2 shown) disposed over zero via (first) interconnect layer 120 and including a plurality of vias 250 laterally positioned outside of keep out zone 152 positioned over TSV 110. Any number of second interconnect layers 222, 224 may be disposed over the first interconnect layer, and each second interconnect layer may include a plurality of vias 250, each via 250 being positioned outside of keep out zone 152 positioned over TSV 110. IC structures 200 also includes at least one post zero via (third) interconnect layer 226, 228, 230 (in this example 3) over at least one second interconnect layer 222, 224. Each third interconnect layer 226, 228, 230 includes a via 254 positioned inside keep out zone 152 positioned over TSV 110 (so no keep out zone 152 in those layers).

Figure 5:
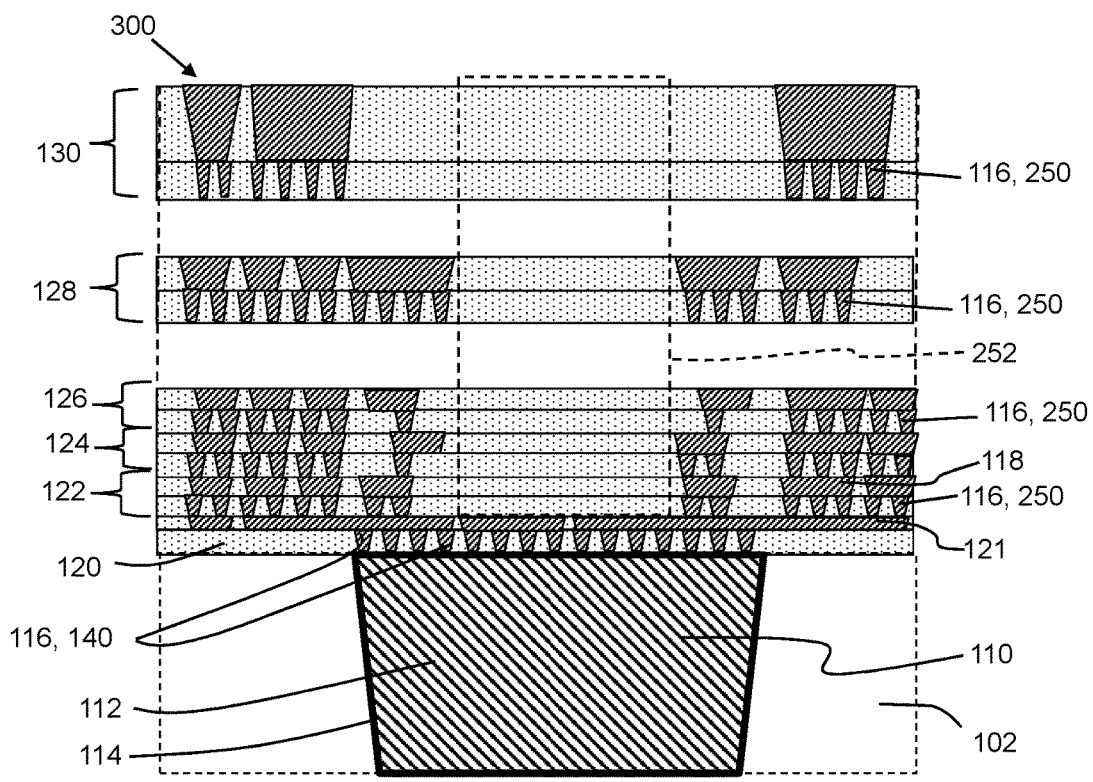
FIG. 5 shows a cross-sectional view of an IC structure including a TSV according to yet another embodiment of the disclosure.

In each of the above-described embodiments, keep out zone 152 includes an entirety of an area of upper surface area 142 of TSV 110. That is, an area of keep out zone 152 matches that of the upper surface of TSV 110. Also, although not necessary in all instances, keep out zone 152 has been shown centered over a center of upper surface area 142 of TSV 110. As shown in the cross-sectional view of FIG. 5 and the plan views of FIGS. 6 and 7 of a second interconnect layer 122, in another embodiment of an IC structure 300, a centered keep out zone 252 may have an area less than upper surface area 142 of TSV 110 (shown in phantom). In this fashion, a portion of plurality of vias 250 are positioned over a portion of upper surface area 142 of TSV 110 outside of centered keep out zone 252. The reduction in the size of keep out zone 252 can vary depending on any number of factors, such as but not limited to: size of TSV 110, materials used, desired stress reduction, desired resistance, etc.

Figure 6:
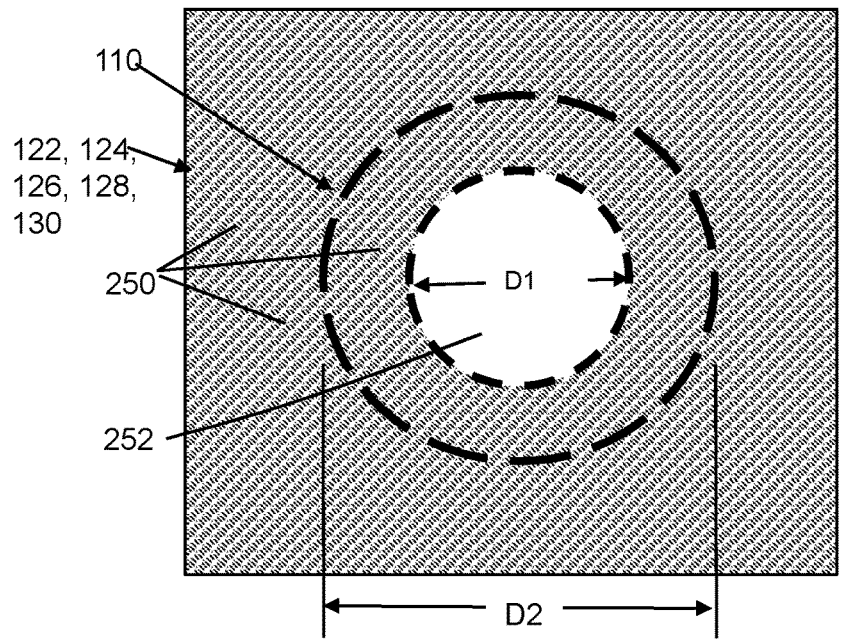
FIG. 6 shows a plan view of a post zero via layer interconnect layer of the IC structure of FIG. 5 with no vias over a keep out zone over the TSV.
Figure 7:
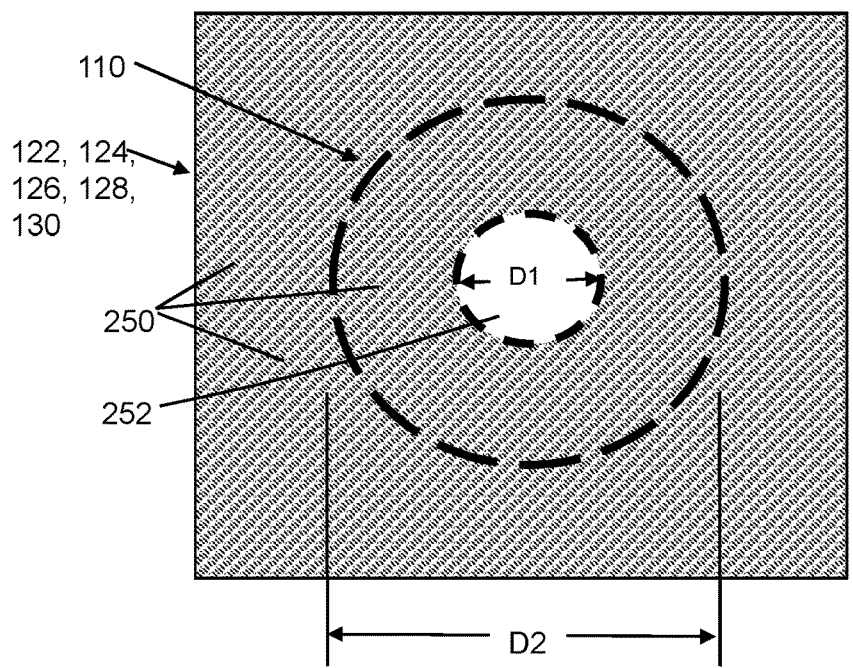
FIG. 7 shows a plan view of a post zero via layer interconnect layer of the IC structure of FIG. 5 with no vias over another keep out zone over the TSV.

In FIGS. 6 and 7, centered keep out zone 252 and TSV 110 each have a circular cross-section, and centered keep out zone 252 has a diameter D1 that ranges from a quarter (FIG. 7) to half (FIG. 6) a diameter D2 of TSV 110. That is, in FIG. 6, centered keep out zone 252 and TSV 110 each have a circular cross-section, and centered keep out zone 252 has a diameter D1 that is half a diameter D2 of TSV 110. In FIG. 7, centered keep out zone 252 and TSV 110 each have a circular cross-section, and centered keep out zone 252 has a diameter D1 that is quarter a diameter D2 of TSV 110. Where a keep out zone and/or a TSV have other than circular cross-sections, the keep out zone may have similarly smaller area than an upper surface area of the TSV.

The above-described IC structures 100, 200, 300 may be fabricated by forming TSV 110 within semiconductor substrate 102, and forming first interconnect layer 120 including plurality of V0 vias 140 disposed on TSV 110. As noted, V0 vias 140 are positioned laterally within upper surface area 142 of TSV. In contrast to conventional processes, at least one second interconnect layer 122, 124, 126, 128 may be formed such that it is disposed over first interconnect layer 120 and includes a plurality of vias 150 laterally positioned outside of keep out zone 152 positioned over TSV 110. An area of keep out zone 152 may match upper surface area 142 of TSV 110, or may have an area less than upper surface area 142 of TSV 110 such that a portion of plurality of vias 150 are positioned over a portion of upper surface area 142 of TSV 110 outside of centered keep out zone 152. At least one third interconnect layer 132, 226, 228, 230 may also be formed over the at least one second interconnect layer 122, 124, 126, 128, 130, 222, 224, where each third interconnect layer includes a via 154, 254 positioned inside keep out zone 152 positioned over TSV 110.

IC structures as described with the placement of vias 150 in interconnect layers 122-130, 222, 224 after V0 layer 120 outside of keep out zone 152 over TSV 110 exhibit reduced stresses created by pumping and reduced first metal layer (M1) dishing, but negligibly increases resistance. In one example, even though vias are out of position compared to conventional situations, the resistance is only increased by approximately 9%.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:
1. An integrated circuit (IC) structure, comprising:
a semiconductor substrate;

a through silicon via (TSV) disposed within the semiconductor substrate, the TSV having an upper surface;

a first interconnect layer above the upper surface of the TSV, the first interconnect layer including at least two zero layer (V0) vias disposed directly on the upper surface of the TSV;

at least two stacked second interconnect layers disposed over the first interconnect layer such that a first second interconnect layer is disposed directly on the first interconnect layer and a second second interconnect layer is disposed directly on the first second interconnect layer, each of the at least two stacked second interconnect layers including a via layer and a metal wire layer; and a keep out zone centered over a center of a surface area of the upper surface of the TSV, wherein the keep out zone is free of vias and wires and extends through the at least two stacked second interconnect layers.

2. The IC structure of claim 1, wherein an area of the keep out zone matches the surface area of the upper surface of the TSV.

3. The IC structure of claim 1, wherein the keep out zone has an area less than the surface area of the upper surface of the TSV, and wherein at least one of the second interconnect layers includes a via positioned over a portion of the upper surface of the TSV outside of the keep out zone.

4. The IC structure of claim 3, wherein the keep out zone and the TSV each have a circular cross-section, and the keep out zone has a diameter that ranges from a quarter to half a diameter of the TSV.

5. The IC structure of claim 3, wherein the keep out zone and the TSV each have a circular cross-section, and the keep out zone has a diameter that is half a diameter of the TSV.

6. The IC structure of claim 3, wherein the keep out zone and the TSV each have a circular cross-section, and the keep out zone has a diameter that is quarter a diameter of the TSV.

7. The IC structure of claim 1, wherein each of the at least two stacked second interconnect layers disposed over the first interconnect layer includes a plurality of vias positioned outside of the keep out zone positioned over the TSV.

8. The IC structure of claim 1, further comprising at least one third interconnect layer over the at least two stacked second interconnect layers, each third interconnect layer including a via positioned over the keep out zone positioned over the TSV.

9. The IC structure of claim 8, wherein the at least one third interconnect layer includes a plurality of third interconnect layers, each successive third interconnect layer including more vias positioned over the keep out zone positioned over the TSV than a preceding third interconnect layer.

10. An integrated circuit structure, comprising:
a semiconductor substrate;
a through silicon via (TSV) disposed within the semiconductor substrate, the TSV having an upper surface;

a first interconnect layer including at least two zero layer (V0) vias disposed directly on the upper surface of the TSV and at least two stacked second interconnect layers disposed directly over the first interconnect layer such that a first second interconnect layer is disposed directly on the first interconnect layer and a second second interconnect layer is disposed directly on the first second interconnect layer, each of the at least two stacked second interconnect layers including a via layer and a metal wire layer, wherein each of the at least two stacked second interconnect layer includes a plurality of vias and metal wires none of which are positioned in a keep out zone centered above a center of a surface area of the upper surface of the TSV.

11. The IC structure of claim 10, wherein the keep out zone has an area less than the surface area of the upper surface of the TSV, and wherein a via of the plurality of vias and metal wires is positioned over a portion of the upper surface of the TSV outside of the keep out zone.

12. The IC structure of claim 10, further comprising a third interconnect layer over the at least two stacked second interconnect layers, the third interconnect layer including a via positioned over the keep out zone positioned over the TSV.

13. The IC structure of claim 1, wherein the first interconnect layer further comprises at least one first metal layer (M1) wire disposed above the plurality of V0 vias, wherein the at least one M1 wire is positioned below the keep out zone.

14. The IC structure of claim 10, wherein the first interconnect layer further comprises at least one first metal layer (M1) wire disposed above the plurality of V0 vias, and wherein the at least one M1 wire is positioned below the keep out zone.

15. An integrated circuit (IC) structure, comprising:
a semiconductor substrate;
a through silicon via (TSV) disposed within the semiconductor substrate, the TSV having an upper surface;
a first interconnect layer above the upper surface of the TSV, the first interconnect layer including at least two vias disposed on the upper surface of the TSV;
a second interconnect layer positioned directly on the first interconnect layer, the second interconnect layer including a via layer and a metal wire layer;
a third interconnect layer positioned directly on the second interconnect layer, the third interconnect layer including a via layer and a metal wire layer; and
a keep out zone free of vias and wires, the keep out zone positioned above and centered relative to a center of the upper surface of the TSV, and extending through the second interconnect layer and the third interconnect layer,
wherein an area of the keep out zone matches a surface area the upper surface of the TSV.

* * * * *